United States Patent
Hartstein et al.

(10) Patent No.: US 11,123,845 B2
(45) Date of Patent: Sep. 21, 2021

(54) VACUUM TABLES

(71) Applicant: HP Indigo B.V., Amstelveen (NL)

(72) Inventors: Yonni Hartstein, Ness Ziona (IL); Yaron Yahav, Ness Ziona (IL)

(73) Assignee: HP Indigo B.V., Amstelveen (NL)

( * ) Notice: Subject to any disclaimer, the term of this patent is extended or adjusted under 35 U.S.C. 154(b) by 30 days.

(21) Appl. No.: 16/617,154

(22) PCT Filed: Jun. 21, 2017

(86) PCT No.: PCT/EP2017/065271
§ 371 (c)(1),
(2) Date: Nov. 26, 2019

(87) PCT Pub. No.: WO2018/233825
PCT Pub. Date: Dec. 27, 2018

(65) Prior Publication Data
US 2020/0180119 A1    Jun. 11, 2020

(51) Int. Cl.
*B25B 11/00*   (2006.01)
*B41F 21/06*   (2006.01)
*C23F 4/00*    (2006.01)

(52) U.S. Cl.
CPC ............ *B25B 11/005* (2013.01); *B41F 21/06* (2013.01); *C23F 4/00* (2013.01)

(58) Field of Classification Search
CPC .................................................... B25B 11/005
USPC ........................................................ 101/408
See application file for complete search history.

(56) References Cited

U.S. PATENT DOCUMENTS

| | | |
|---|---|---|
| 3,777,158 A | 12/1973 | Kamogawa et al. |
| 4,853,735 A | 8/1989 | Kodama et al. |
| 5,087,943 A | 2/1992 | Creveling |
| 5,883,643 A * | 3/1999 | Mok ............... B41J 13/22 347/4 |

(Continued)

FOREIGN PATENT DOCUMENTS

| | | |
|---|---|---|
| DE | 10232255 A1 | 2/2004 |
| EP | 1641028 A1 | 3/2006 |

(Continued)

*Primary Examiner* — Anthony H Nguyen
(74) *Attorney, Agent, or Firm* — HP Inc. Patent Department (57) ABSTRACT

There is disclosed a vacuum table 400 comprising a vacuum plate 402 separating a first vacuum chamber 406 from a substrate zone 60 for receiving a substrate 50. The vacuum plate has a plurality of suction holes 404 for conveying a gas flow from the substrate zone 60 to the first vacuum chamber 406. There is an evacuation port 422 in communication with a second vacuum chamber 420 to evacuate gas from the substrate zone 60 when a substrate 50 is received over the suction holes 404 of the vacuum plate 402, and a vacuum port 424 for discharging gas received in the second vacuum chamber 420 to a vacuum source 423. The first vacuum chamber 406 and the second vacuum chamber 420 are in fluid communication via a valve 430 so that gas flows from the first vacuum chamber 406 to the vacuum port 424 via the second vacuum chamber 420. The valve 430 is controllable to vary a gas flow rate through the vacuum plate 402 and thereby vary a retaining force on a substrate 50 received thereon.

14 Claims, 4 Drawing Sheets

(56) References Cited

U.S. PATENT DOCUMENTS

| | | | |
|---|---|---|---|
| 5,947,027 A * | 9/1999 | Burgin | B82Y 30/00 |
| | | | 101/474 |
| 6,138,564 A * | 10/2000 | Eckardt | B65H 23/245 |
| | | | 101/228 |
| 6,339,688 B1 | 1/2002 | Cho et al. | |
| 10,046,471 B1 * | 8/2018 | Bloch | B23Q 3/088 |
| 2006/0132737 A1 * | 6/2006 | Magome | G03F 7/70725 |
| | | | 355/53 |
| 2006/0237391 A1 * | 10/2006 | Aramaki | H01L 21/76807 |
| | | | 216/67 |
| 2014/0262755 A1 * | 9/2014 | Deshmukh | H01J 37/32431 |
| | | | 204/192.35 |
| 2015/0228458 A1 * | 8/2015 | Harada | H01J 37/32165 |
| | | | 216/67 |
| 2015/0258818 A1 * | 9/2015 | Sakai | B41J 3/28 |
| | | | 347/104 |

FOREIGN PATENT DOCUMENTS

| | | | |
|---|---|---|---|
| JP | 6281671 A | | 4/1987 |
| JP | 2005169592 A | | 6/2005 |
| WO | WO-2009044469 A1 | | 4/2009 |

* cited by examiner

VACUUM TABLES

BACKGROUND

The disclosure relates to a vacuum table.

Vacuum tables can be used to retain a workpiece or substrate against the table, for example to inhibit a workpiece or substrate from lifting off the table.

BRIEF DESCRIPTION OF DRAWINGS

Examples will now be described, by way of non-limiting example, with reference to the accompanying drawings, in which.

DETAILED DESCRIPTION

Figure 1:
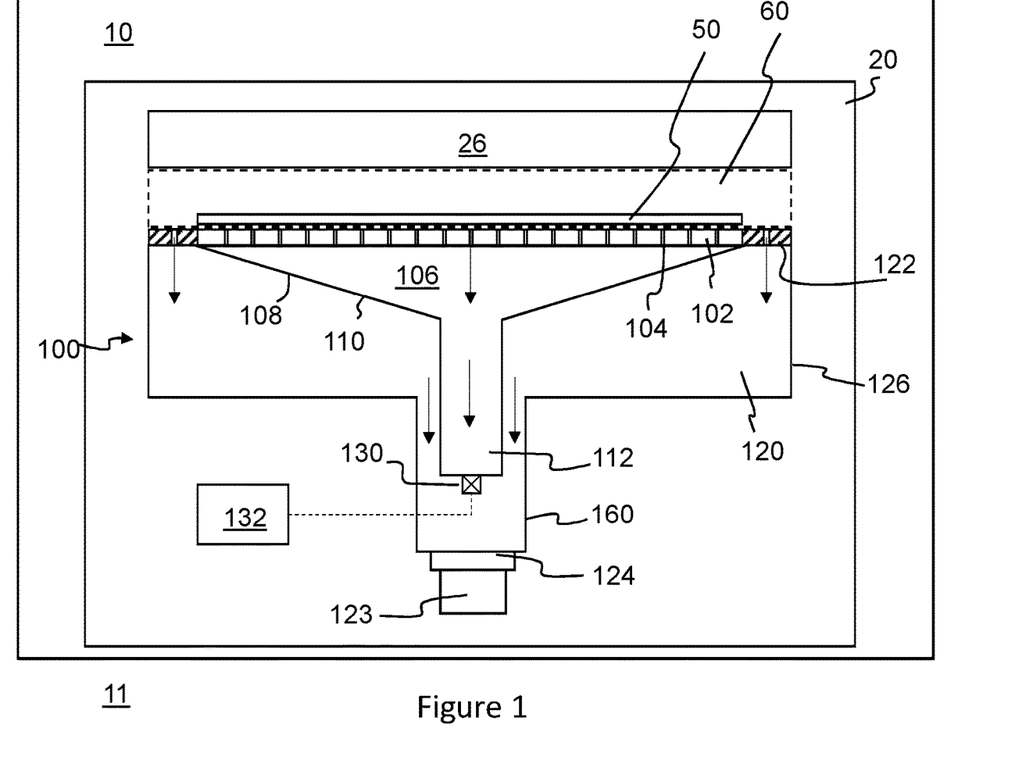
FIG. 1 is a simplified schematic of an example treatment unit comprising a vacuum table.

FIG. 1 schematically shows a treatment unit 10 comprising a housing 20, a vacuum table 100, treatment equipment 26 and a substrate zone 60. In this particular example, the treatment unit 10 is a corona discharge treatment unit, and the treatment equipment 26 comprises conductors for ionising gas within the substrate zone 60.

In corona discharge treatment, a surface of media substrate may become charged, which may modify a surface tension of the substrate. Modification of the surface tension may be beneficial for downstream processes, such as the application of a print agent to the substrate in a printing operation. A corona discharge process ionises gas, which can lead to the generation of harmful ozone to be safely evacuated from the treatment unit.

Corona discharge treatment is just one example of a treatment unit which may use a vacuum table and in which gas may be evacuated.

The vacuum table 100 is disposed within the housing 20. The vacuum table 100 of this example comprises a planar vacuum plate 102 comprising a plurality of suction holes 104 extending through the vacuum plate 102 and arranged in a grid. The cross-sectional view of FIG. 1 is transverse to a media-feed direction through the housing over the vacuum table 100. The media-feed direction extends from a media inlet adjacent a first end of the vacuum plate 102 and a media outlet adjacent an opposing second end of the vacuum plate. The media inlet and media outlet comprise respective sets of rollers for guiding media substrate 50 into the treatment unit 10 onto the vacuum table 100, and from the vacuum table 100 out of the treatment unit 10.

In this example, the vacuum plate 102 has a horizontal and upward facing orientation, and the treatment equipment 60 is disposed over and opposite the vacuum plate 102. In other examples, at least the treatment equipment 60 may be provided in other positions or configurations.

As shown in FIG. 1, in this example there is a substrate zone 60 over the vacuum plate 102 for receiving a substrate i 50. In this particular example, the vacuum table 100 is disposed within the treatment unit 10 and the substrate zone 60 is defined between the vacuum plate 102, treatment equipment 60, and the media inlet and media outlet.

The substrate 50 may be continuous media (web-fed media) to be fed through the treatment unit as continuous stock from the media inlet to the media outlet, or may comprise sheet media, for example as fed from a stock of individual sheets of media or cut from a web before being provided to the treatment unit 10 (sheet-fed media). In this particular example the substrate 50 is sheet media.

The vacuum plate 102 separates the substrate zone 60 from a first vacuum chamber 106 which is partly defined by a side of the vacuum plate 102 opposite the substrate zone 60. Accordingly, in this example the first vacuum chamber 106 is disposed below the vacuum plate 102.

In this particular example, the first vacuum chamber 106 is defined between the vacuum plate 102 and a partition wall 108 disposed below the vacuum plate so that the first vacuum chamber 106 is to receive gas flow through the suction holes 104 in the vacuum plate 102.

The partition wall 108 may be of any suitable shape. In this particular example, the partition wall 108 comprises inclined wall sections 110 which taper downwards from edges of the vacuum plate and in the form of a rectangular funnel and terminate at a substantially cylindrical partition outlet section 112 of the wall 108.

The vacuum table 100 further comprises a second vacuum chamber 120 comprising at least one evacuation port 122 to receive a gas flow from the substrate zone 60 into the vacuum chamber 120, and a vacuum port 124 to be connected to a vacuum source 123 to discharge gas from the second vacuum chamber 120. For example, the vacuum source 123 may be a vacuum pump.

In this example, there are a plurality of evacuation ports 122 at positions adjacent the vacuum plate 102. In this particular example, the evacuation ports 122 are substantially flush with the vacuum plate 102, but in other examples each evacuation port 122 may be disposed at any position relative the vacuum plate 102 so that the evacuation port 122 is in fluid communication with the substrate zone 60, for example at a position below or above the vacuum plate 102. Each evacuation port 122 may be provided in a wall of the second vacuum chamber 120 or may extend from the second vacuum chamber 120.

In this example, the second vacuum chamber 120 is defined between an outer side of the partition wall 108 described above and a vacuum casing 126 which is disposed around the partition wall 108, so that the first vacuum chamber 106 is disposed within the second vacuum chamber 120 in a nested arrangement. In this particular example, the vacuum casing 126 comprises a cuboidal shell 126 extending below the level of the vacuum plate 102, and a substantially cylindrical casing outlet section 160 extending downwardly from a central region of the shell 126. The vacuum casing 126 surrounds the partition wall 108 so that the inclined wall sections 110 of the partition wall 108 are disposed within the cuboidal shell 126 of the vacuum casing 126, and the cylindrical partition outlet section 112 of the partition wall 108 extends partly into the cylindrical casing outlet section 160 of the vacuum casing 126. The particular shapes of the partition wall 108 and vacuum casing 126 are examples only, and any suitable shape may be used.

In this example, a vacuum zone is defined between the vacuum casing 126 and the vacuum plate 102. The partition wall 108 extends from the vacuum plate 102 into the vacuum casing 126 to partition the vacuum zone into the first vacuum chamber 106 and the second vacuum chamber 120.

In this example, the evacuation ports 122 are provided at a junction between the partition wall 108 and the vacuum casing 126. In other examples, the evacuation ports may project from the vacuum casing 126 or partition wall 108.

The vacuum port 124 may be provided in a wall of the vacuum casing 126. In this particular example, the vacuum port 124 is provided in the lowermost wall of the cylindrical casing outlet section 160 to discharge gas from the second vacuum chamber.

In this example, a valve 130 is provided between the first vacuum chamber 106 and the second vacuum chamber 120. In this example, the valve 130 is provided in a wall of the partition outlet section 112 of the partition wall 108 (in particular, in the lowermost wall of the outlet section 112). In this particular example, the valve 130 is coupled to a controller 132 to control the valve to vary a gas flow rate through the first vacuum chamber 106, and thereby through the vacuum plate 102.

The valve 130 may be any suitable type of valve, such as a diaphragm valve or ball valve. The valve 130 may comprise an actuator mechanism which may extend through a wall of the vacuum casing 126. Providing the valve in the partition outlet section 112 of the partition wall 108 may enable a simple actuator mechanism for the valve to extend through the vacuum casing 126, since the partition outlet section 112 may extend into a corresponding casing outlet section 112 in a nested arrangement so that a distance for the actuator mechanism to extend between the vacuum casing 126 and the partition wall 108 is relatively low.

In this particular example, the controller is to vary the gas flow rate through the vacuum plate from between 0% and 1% of a total flow through the vacuum port, so as to vary a retaining force on the substrate 50 against the vacuum plate 102, as will be described below with respect to an example of use.

The controller may be to control the gas flow rate through the vacuum plate 102 based on a substrate type of a substrate 50 received (or to be received) in the substrate zone 60. In particular, a retaining force holding the substrate (e.g. sheet media) received in the substrate zone 60 against the vacuum table 102 may be a function of the gas flow rate through the vacuum plate 102. The controller may be to control the gas flow rate so that substrates of different types experience different retaining forces, such as paper, card, metallized board or webbing. For example, it may be desirable to have a higher retaining force for a relatively higher grammage substrate (grams per square metre) as compared with a lower grammage substrate. Yet further, it may be desirable to have a different retaining forces for substrates of different finishes or material type (e.g. polymer, card, paper). In particular, it may be desirable to control a friction force between the vacuum table and the substrate. The friction force may be a function of the retaining force acting perpendicular to the vacuum table and a static and/or dynamic coefficient of friction between the substrate and the vacuum table, which may vary between different substrate types. Accordingly, the controller may be to control the gas flow rate through the vacuum plate based on a substrate type to obtain a target retaining force, which may be determined based on a target friction force. For example, a relatively low gas flow rate of 1 litre/minute through the vacuum plate 102 may correspond to a relatively low retaining force of 10N on the substrate 50, whereas a relatively higher gas flow rate of 3 litres/minute may corresponding to a relatively higher retaining force of 14N on the substrate 50. Further, the gas flow rates or valve settings associated with different substrate types may be such that a substrate having a relatively lower coefficient of friction is associated with a relatively higher gas flow rate leading to a relatively higher retaining force. The target friction force (and thereby a target retaining force and a target gas flow rate or valve setting) may further depend on a weight or grammage of the material and/or inertial calculations which may depend on the feed rate at which the substrate is fed through the substrate zone. The controller may be to control the gas flow rate through the valve by setting the valve to predetermined valve settings based on the substrate type. In other examples, the controller may be to control the gas flow rate through the valve based on a monitored gas flow rate through the vacuum plate, for example as determined by a flow meter in the first vacuum chamber.

The controller may be to determine the substrate type based on instructions received for a treatment operation, which may be part of instructions received as part of a printing operation using print apparatus 11 including the treatment unit 10. In some examples, the controller may be to determine the substrate type based on user input received via a user interface. In yet further examples, the controller may be to determine the substrate type based on sensing the substrate type, for example by using an image sensor to read a code on a substrate relating to the substrate type.

Figure 2:
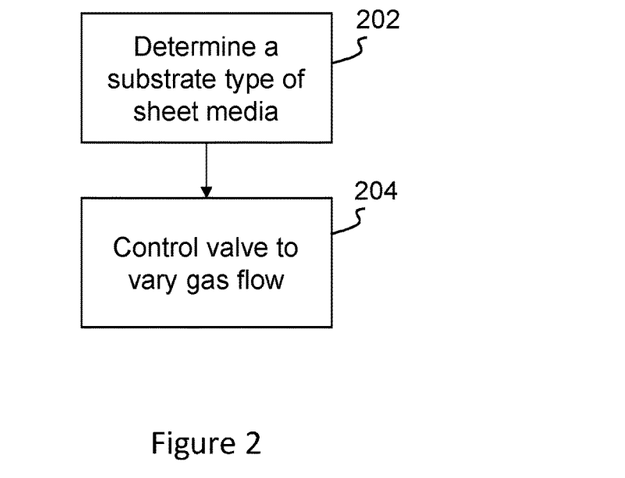
FIG. 2 is a flowchart of a method of controlling a gas flow in the treatment unit of FIG. 1.

An example treatment operation will now be described with respect to FIG. 2. In use, a substrate 50 is fed into the treatment unit 10, in particular sheet media such as paper, via the media inlet to be received in the substrate zone 60. The treatment equipment is activated to ionise gas within the substrate zone 60, which may alter surface properties of the substrate 50. A vacuum source 123 coupled to the vacuum port 124 is active so that there is a pressure differential between the vacuum port 124 and the substrate zone 60. This pressure differential causes ionised gas to flow along two routes from the substrate zone 60 to the vacuum port 124. The first route is through the suction holes 104 in the vacuum plate 102, through the first vacuum chamber 106 and into the second vacuum chamber 120 via the valve 130, and to the vacuum port 124. The second route is through the evacuation ports 122 into the second vacuum chamber and to the vacuum port 124.

In this example there is more resistance to gas flow along the first route, in particular at the suction holes 104 which may be relatively narrow and partially occluded by the substrate, and also at the valve 130. Accordingly, the gas flow rate along the second route is significantly larger than the gas flow rate along the first route. In this particular example, the gas flow rate through the vacuum port 124 (i.e. the combined gas flow along the first and second routes) is approximately 10,000 litres per minute, whereas the gas flow rate through the vacuum plate 102 is 100 litres per minute or less, for example up to 10 litres per minute or up to 5 litres per minute.

In block 202, the controller determines a substrate type of the sheet media. In this particular example, the controller 132 determines a type of sheet media based on the receipt of print operation instructions indicating that the substrate type is 200 gsm paper. In this example, the controller 132 includes a look-up table or other database correlated by substrate type which is stored in a memory of the controller. The controller 132 interrogates the look-up table to obtain a valve setting corresponding to the substrate type, and controls the valve 130 to move to the respective valve setting. In other examples, the controller 132 may determine a target gas flow rate for the substrate type, and may operate a feedback loop based on an output of a flow meter in the first vacuum chamber 106 to determine the gas flow rate therethrough.

In block 204, the controller 132 controls the valve 130 to vary the flow rate through the vacuum plate 102 based on the substrate type. In this particular example, the valve setting corresponds to a gas flow rate through the vacuum plate 102 of approximately 3 litres per minute.

Figure 3:
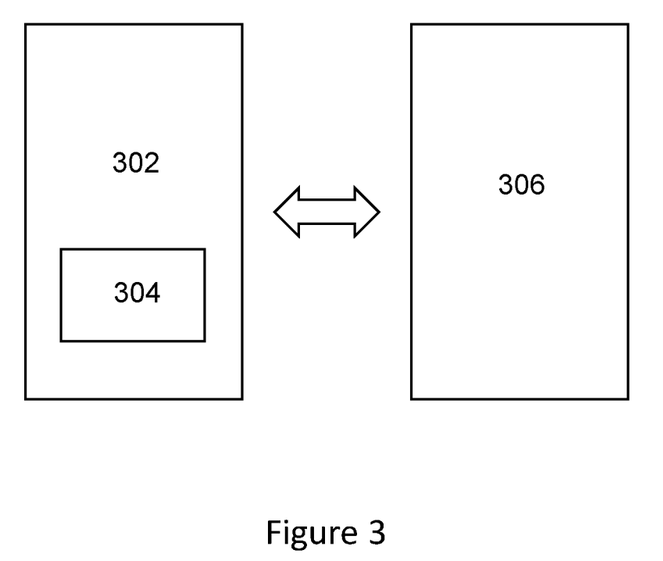
FIG. 3 schematically shows a non-transitory machine-readable medium and a processor is a simplified schematic of a vacuum table.

In this example, the controller 132 comprises a processor and a non-transitory machine-readable medium (e.g. a memory) encoded with instructions, executable by a processor, to determine the substrate type and control the valve as described above with respect to blocks 202, 204. FIG. 3 shows a non-transitory machine-readable medium 302 of the controller 132 including such instructions 304, executable by a processor 304 of the controller 132.

Figure 4:
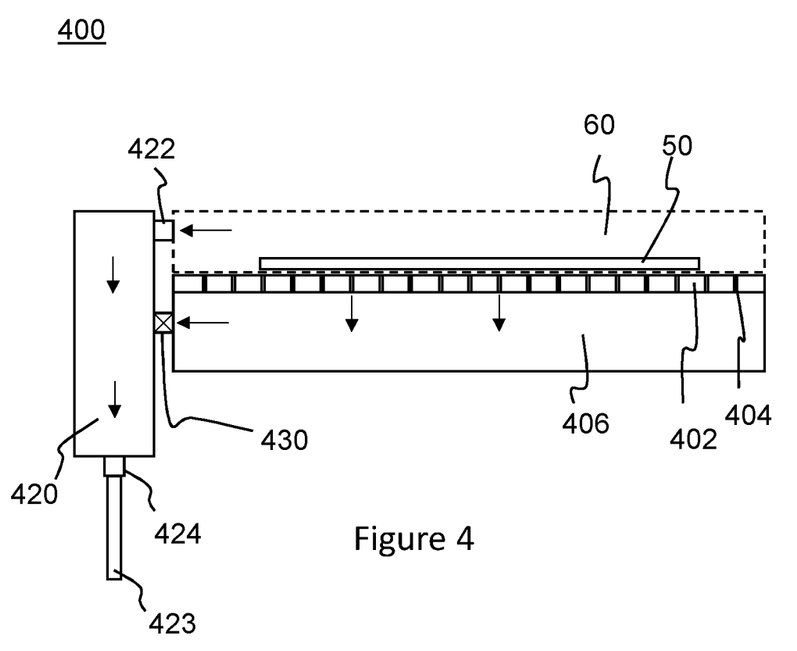
FIG. 4 is a simplified schematic of a further example vacuum table

FIG. 4 shows a further example of a vacuum table 400. The vacuum table comprises a substantially planar vacuum plate 402 comprising a plurality of suction holes 404 extending therethrough as described above with respect to the vacuum table 100 of FIG. 1. The vacuum plate 402 separates a substrate zone 60 for receiving a substrate 50 onto the vacuum plate 402 from a first vacuum chamber 106 which is to receive a gas flow through the suction holes 404. In this example, the first vacuum chamber 406 is substantially cuboidal. The vacuum table 400 further comprises a second vacuum chamber 420 which in this example is disposed laterally adjacent the first vacuum chamber and extends from below the level of the vacuum plate 402 to above the level of the vacuum plate 402. The second vacuum chamber 420 comprises an evacuation port 122 in communication with an upper region of the substrate zone 60 and a vacuum port 424 to be coupled to a vacuum source 423 such as a vacuum pump. There is a valve 430 disposed between the first vacuum chamber 406 and the second vacuum chamber 420 so that, in use, gas flows from the first vacuum chamber 406 to the vacuum port 424 via the second vacuum chamber 420.

Figure 5:
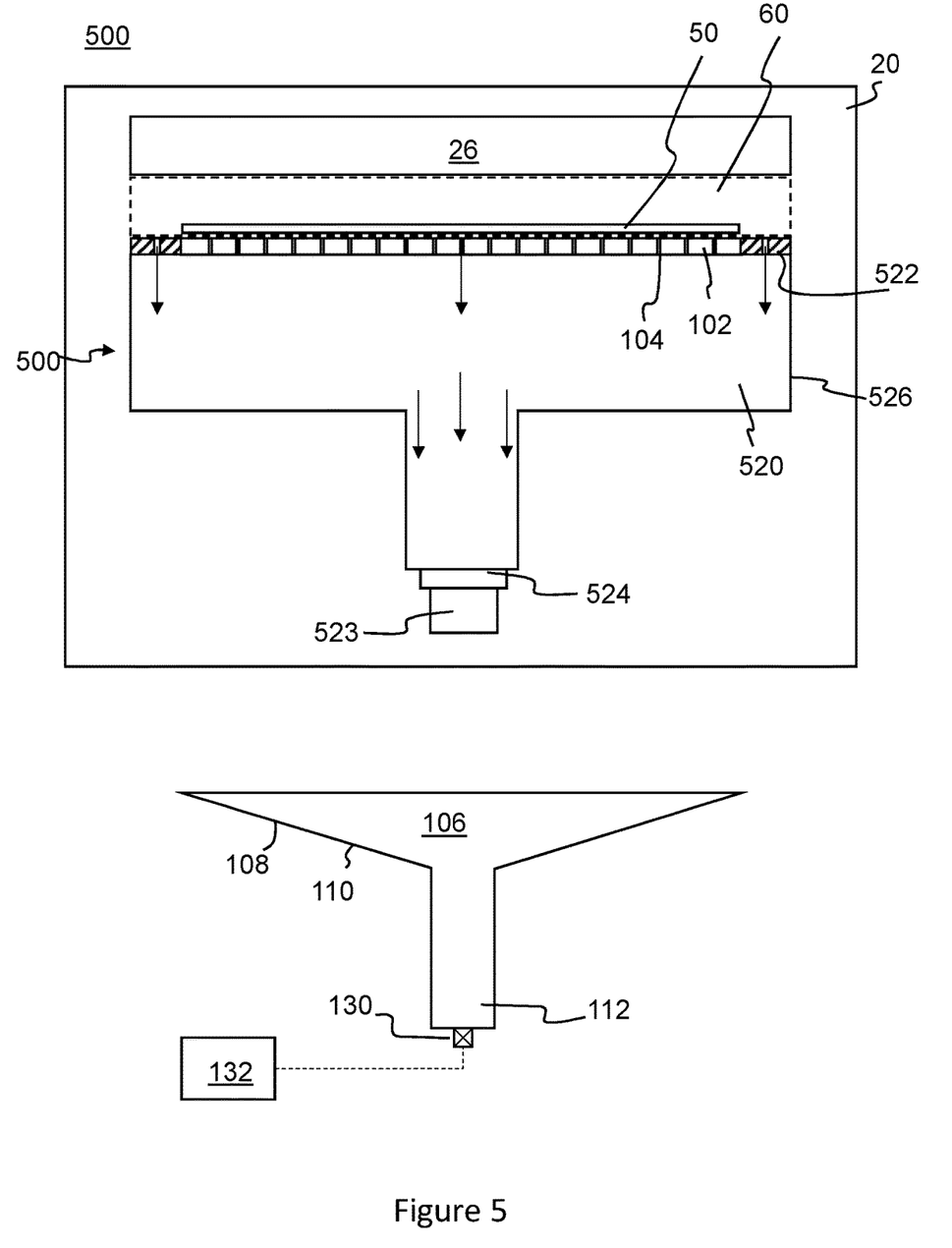
FIG. 5 shows a treatment unit having a compound vacuum chamber and a partition wall to be installed in the vacuum chamber.

FIG. 5 shows a treatment unit 500 which differs from the treatment unit 10 described above with respect to FIG. 1 in that the vacuum table 500 has no separate first and second vacuum chambers. Instead, there is a compound vacuum chamber 520 defined between a vacuum casing 526 and a vacuum table 102 which is in communication with both the suction holes 104 in the vacuum plate 102, and the evacuation ports 522, and a vacuum port 524 for discharge of gas received in the compound vacuum chamber. The vacuum casing 526 is substantially of the form described with respect to the vacuum casing 126 of FIG. 1. In use, the treatment unit 500 generates ionised gas which is evacuated from the substrate zone 60 through the compound vacuum chamber 520 through the evacuation ports and the vacuum holes to the vacuum port 524 which is coupled to a vacuum source 523. The gas flow rate through the suction holes 104 in the vacuum plate 102 cannot be controlled independently of the net flow rate through the vacuum port 524 as a whole.

FIG. 5 additionally shows a partition wall 108, valve 130 and valve controller 132 to be installed in the compound vacuum chamber 520 as will be described below with respect to FIG. 6. In this example, the partition wall 108 is substantially as described with respect to FIG. 1 above.

Figure 6:
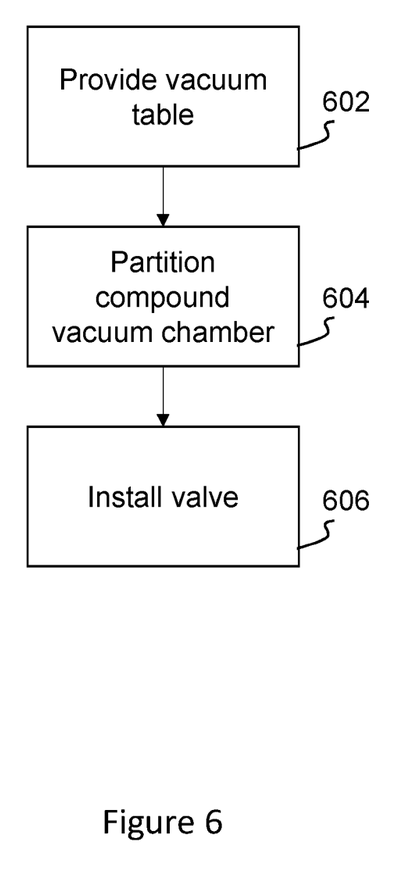
FIGS. 6 and 7 are flowcharts of example methods of modifying a vacuum table.

FIG. 6 is a flowchart of a method of partitioning a compound vacuum chamber in a vacuum table. The method will be described with respect to retrofitting the example partition wall 108 into the example treatment unit 500 of FIG. 5 to provide a treatment unit having separate first and second vacuum chambers, for example as described above with respect to the treatment unit 10 of FIG. 1.

In block 602, a vacuum table 500 is provided. The vacuum table 500 has a vacuum plate 102 separating a compound vacuum chamber 520 from a substrate zone 60, and there are a plurality of suction holes 104 in the vacuum plate 102 for conveying a gas flow from the substrate zone 60 to the compound vacuum chamber 520. There is an evacuation port 522 in communication with the compound vacuum 520 chamber to evacuate gas from the substrate zone 60 when a substrate is received over the suction holes 104 of the vacuum plate 102. There is a vacuum port 524 for discharging gas received in the compound vacuum chamber 520 to a vacuum source 523.

In block 604, the compound vacuum chamber 520 is partitioned to provide a first vacuum chamber 106 (as shown in FIG. 1) to receive a gas flow through the suction holes 104 and a second vacuum chamber 120 to receive a gas flow through the or each evacuation port 522 (as shown in FIG. 1 with respect to the evacuation port 122). Accordingly, there is no direct flow from the vacuum plate 102 into the second vacuum chamber, and no direct flow from the evacuation port 122 into the first vacuum chamber.

In block 604, a valve 130 is installed for fluid communication between the first vacuum chamber 106 and the second vacuum chamber 120 so that in use gas flows from the first vacuum chamber 106 to the vacuum port 124 via the second vacuum chamber 120. The valve 130 is controllable to vary a gas flow rate through the vacuum plate 102. The first vacuum chamber 106 may be disposed within the second vacuum chamber 120 in a nested arrangement as shown in FIG. 1.

Figure 7:
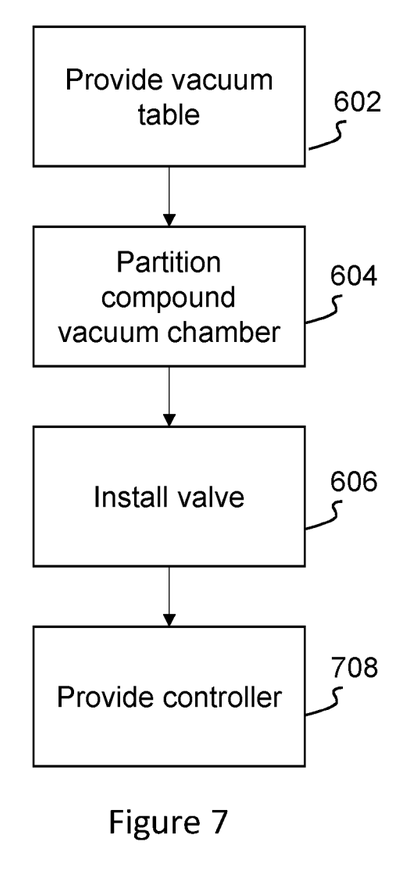

FIG. 7 shows a further example method of partitioning a compound vacuum chamber which differs from the method described with respect to FIG. 6 in that it further comprises in block 708 providing a controller 132 to control the valve to vary the gas flow rate through the vacuum plate based on a substrate 50 to be received in the substrate zone 60. The controller 132 may have any of the features described above with respect to the controller 132 of FIG. 1. In particular, the controller may be to determine a substrate type of the substrate to be received in the substrate zone, and the controller may control the valve to vary the gas flow rate through the vacuum plate based on the substrate type determined.

Examples in the present disclosure can be provided as methods, systems or machine readable instructions, such as any combination of software, hardware, firmware or the like. Such machine readable instructions may be included on a computer readable storage medium (including but is not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each flow and/or block in the flow charts and/or block diagrams, as well as combinations of the flows and/or diagrams in the flow charts and/or block diagrams can be realized by machine readable instructions.

The machine readable instructions may, for example, be executed by a general purpose computer, a special purpose computer, an embedded processor or processors of other programmable data processing devices to realize the functions described in the description and diagrams. In particular, a processor or processing apparatus may execute the machine readable instructions. Thus functional modules of the apparatus and devices may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable storage that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A vacuum table comprising:
a vacuum plate separating a first vacuum chamber from a substrate zone for receiving a substrate, the vacuum plate having a plurality of suction holes for conveying a gas flow from the substrate zone to the first vacuum chamber;
an evacuation port in communication with a second vacuum chamber to evacuate gas from the substrate zone when a substrate is received over the suction holes of the vacuum plate;
a vacuum port for discharging gas received in the second vacuum chamber to a vacuum source; and
wherein the first vacuum chamber and the second vacuum chamber are in fluid communication via a valve so that gas flows from the first vacuum chamber to the vacuum port via the second vacuum chamber; and
wherein the valve is controllable to vary a gas flow rate through the vacuum plate and thereby vary a retaining force on a substrate received thereon.

2. A vacuum table according to claim 1, wherein valve is controllable to vary the gas flow through the vacuum plate from between 0% and 1% of a total flow through the vacuum port.

3. A vacuum table according to claim 1, wherein a vacuum zone is defined between the vacuum plate and a vacuum casing, and wherein a chamber partition extends into the vacuum zone to partition the vacuum zone into the first vacuum chamber and the second vacuum chamber.

4. A vacuum table according to claim 1, wherein a chamber partition defines an outer wall of the first vacuum chamber and an inner wall of the second vacuum chamber, so that the second vacuum chamber surrounds the first vacuum chamber.

5. A vacuum table according to claim 1, wherein the first vacuum chamber is disposed within the second vacuum chamber in a nested arrangement.

6. A vacuum table according to claim 1, further comprising a controller to control the valve to vary the gas flow rate through the vacuum plate based on a substrate to be received in the substrate zone.

7. A vacuum table according to claim 6, wherein the controller is to determine a substrate type of the substrate to be received in the substrate zone, and to control the valve to vary the gas flow rate through the vacuum plate based on the substrate type.

8. A treatment unit comprising a vacuum table in accordance with claim 1.

9. A non-transitory machine-readable medium encoded with instructions executable by a processor and comprising instructions to:
determine a substrate type of a substrate selected for a printing operation from a plurality of substrate types, wherein the substrate is to be received in a substrate zone of a printing apparatus and retained on a vacuum table having a plurality of suction holes, and wherein gas in the substrate zone is to be evacuated through an evacuation port;
control a valve between a first vacuum chamber in communication with the suction holes and a second vacuum chamber in communication with the evacuation port to vary a gas flow through the suction holes and thereby vary a retaining force on the substrate;
wherein the valve is controlled based on the type of substrate determined for the printing operation.

10. A method comprising:
providing a vacuum table comprising:
a vacuum plate separating a compound vacuum chamber from a substrate zone for receiving a substrate, the vacuum plate having a plurality of suction holes for conveying a gas flow from the substrate zone to the compound vacuum chamber;
an evacuation port in communication with the compound vacuum chamber to evacuate gas from the substrate zone when a substrate is received over the suction holes of the vacuum plate; and
a vacuum port for discharging gas received in the compound vacuum chamber to a vacuum source;
partitioning the compound vacuum chamber to provide a first vacuum chamber to receive a gas flow through the suction holes and a second vacuum chamber to receive a gas flow through the evacuation port;
installing a valve for fluid communication between the first vacuum chamber and the second vacuum chamber so that gas flows from the first vacuum chamber to the vacuum port via the second vacuum chamber, wherein the valve is controllable to vary a gas flow rate through the vacuum plate.

11. A method according to claim 10, wherein the valve is controllable to vary the gas flow through the vacuum plate from between 0% and 1% of a total flow through the vacuum port.

12. A method according to claim 10, wherein the first vacuum chamber is disposed within the second vacuum chamber in a nested arrangement.

13. A method according to claim 10, further comprising providing a controller to control the valve to vary the gas flow rate through the vacuum plate based on a substrate to be received in the substrate zone.

14. A method according to claim 13, wherein the controller is to determine a substrate type of the substrate to be received in the substrate zone, and wherein the wherein the controller is to control the valve to vary the gas flow rate through the vacuum plate based on the substrate type.

* * * * *